United States Patent [19]
Yeom et al.

[11] Patent Number: 5,280,539
[45] Date of Patent: Jan. 18, 1994

[54] SYNCHRONOUS CIRCUIT FOR SERIAL INPUT SIGNAL

[75] Inventors: Heecheol H. Yeom, Bucheon; Bangwon Lee, Kwangmyung, both of Rep. of Korea

[73] Assignee: Samsung Electronics Co., Ltd., Kyunggi, Rep. of Korea

[21] Appl. No.: 889,983

[22] Filed: May 29, 1992

[30] Foreign Application Priority Data

Jan. 15, 1992 [KR] Rep. of Korea ............... 92-508

[51] Int. Cl.[5] .................................. H04L 7/00
[52] U.S. Cl. .......................... 375/106; 375/119
[58] Field of Search ........... 328/63, 72; 307/511; 331/1R; 25; 375/106, 108, 119, 120

[56] References Cited

U.S. PATENT DOCUMENTS

| | | | |
|---|---|---|---|
| 4,689,575 | 8/1987 | Ott | 328/63 |
| 4,771,441 | 9/1988 | Spengler | 375/106 |
| 4,876,700 | 10/1989 | Grindahl | 375/87 |
| 5,111,486 | 5/1992 | Oliboni | 375/120 |

*Primary Examiner*—Curtis Kuntz
*Assistant Examiner*—Paul Loomis
*Attorney, Agent, or Firm*—Watson, Cole, Grindle & Watson

[57] ABSTRACT

There is disclosed a synchronous circuit having the function of generating a detecting signal to detect a serial input signal by a receiving stage, and capable of reducing erroneous data by generating a reset signal at every rising and falling edge of the serial input signal.

8 Claims, 3 Drawing Sheets

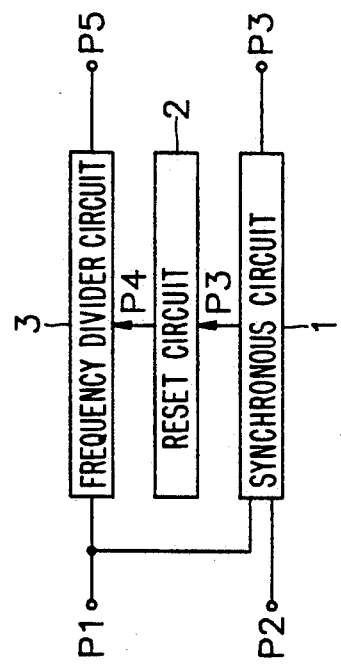

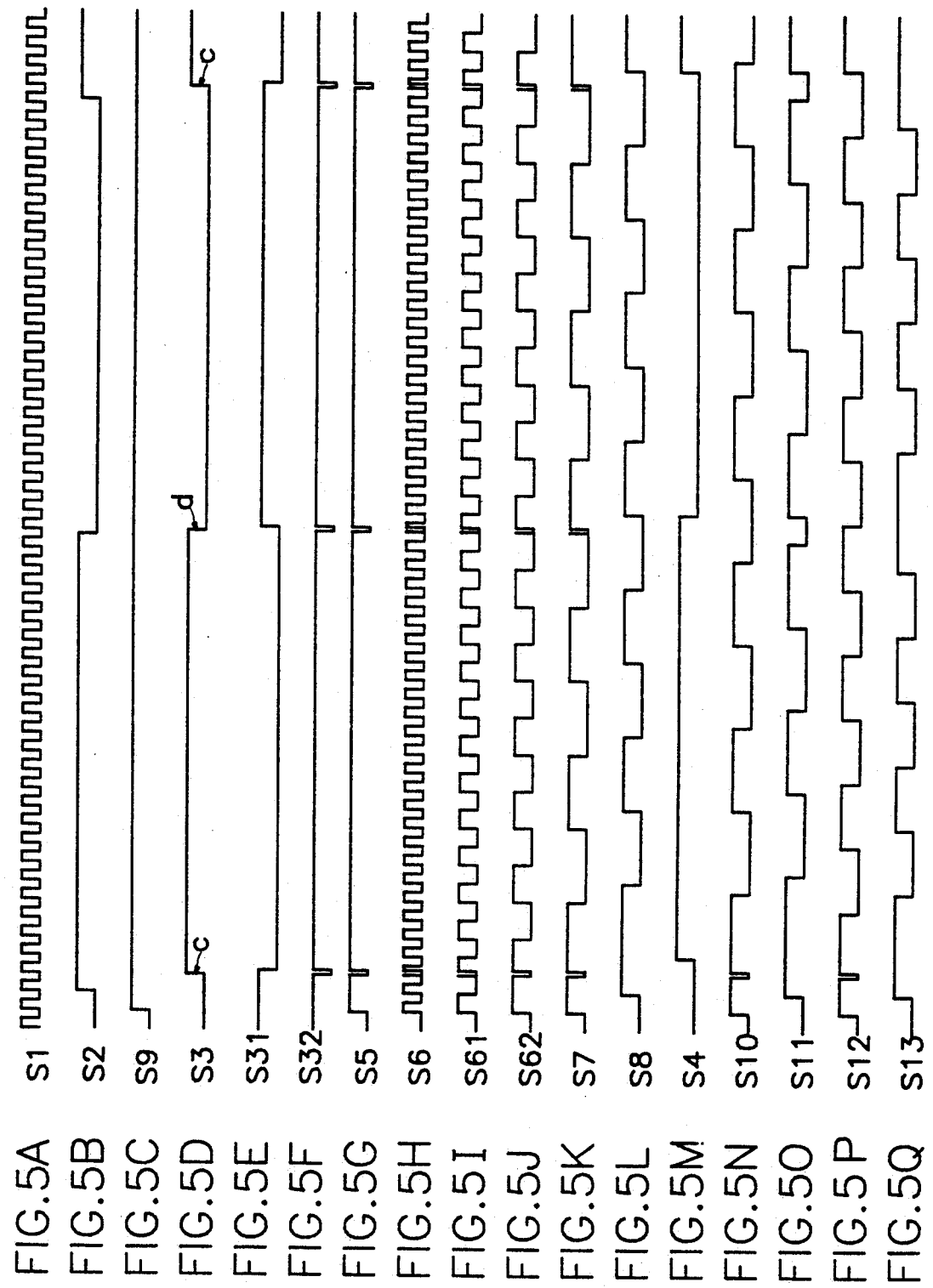

SYNCHRONOUS CIRCUIT FOR SERIAL INPUT SIGNAL

BACKGROUND OF THE INVENTION

1. Field of the invention

The present invention relates to a circuit for synchronizing a serial input signal with a clock signal, and more particularly to such a synchronous circuit for generating a detecting signal in response to the serial input signal to enhance the immunity from signal malfunctions that may occur, because the detecting period of the received signal is changed due to the change of the reference frequency, i.e. the change in the period or frequency of the clock signal according to the variation of the temperature or the ambient environment.

2. Related Art

A conventional circuit for synchronizing a serial input signal generates output signals synchronized with the initial rising of a serial in the serial input signal, or just in the case where the serial input signal itself rises.

A conventional circuit for synchronizing the serial input signal to output a synchronized serial input signal and detecting signal to detect the received input signal is shown in FIG. 1 and includes a synchronous circuit 1 for synchronizing a serial input signal P2 according to a clock signal $P_1$ to provide a synchronized serial input signal P3. A reset circuit 2 outputs a reset signal P4 according to the output of the synchronous circuit 1. A frequency divider circuit 3 generates a detecting signal P5 by dividing the reference frequency of the clock signal P1 according to the reset signal P4 output from the reset circuit 2.

The synchronous circuit 1 receives the clock signal $P_1$ and serial input signal P2. The synchronous circuit 1 synchronizes the serial input signal P2 with a rising edge of the clock signal P1, and outputs the serial input signal P3. The synchronized serial input signal P3 is input to the reset circuit 2 and the reset signal P4, synchronized with the initial rising edge of the synchronized serial signal P3, is output.

As shown in the waveform of FIG. 2(D), the reset signal P4 is still at high level. Reset signal P4 is supplied to the frequency divider circuit 3 to which the clock signal P1 is also input.

The frequency divider circuit 3 begins to operate when the rising edge of reset signal P4 is detected and divides the reference frequency of the clock signal P1 and then outputs the detecting signal P5 that is necessary for detecting the synchronized serial input signal P3.

The synchronized serial input signal P3 is output after being synchronized in the synchronous circuit 1 when the clock signal P1 and received serial input signal P2 are input to the synchronous circuit 1 as shown in FIGS. 2(A) and 2(B), and is synchronized at a rising edge of the signal, when the serial input signal P2 is input and the clock signal P1 is at a high level for the first time, and then output as shown in FIG. 2(,C).

The synchronized serial input signal P3 is input to the reset circuit 2, and the reset signal P4 is output as shown in FIG. 2(D). This reset signal P4 is synchronized at the initial rising edge of the synchronized serial input signal P3 and then supplied as a reset signal to the frequency divider circuit 3.

According to the operational waveforms of FIGS. 2(A)–2(B), showing the operation of the circuit of FIG. 1, an initial pulse of the first serial input signal P2 is used after being synchronized at the rising edge of the clock signal P1, and therefore the detecting signal P5 that is output by inputting the clock signal P1 and reset signal P4, when the reference frequency of the clock signal P1 changes in accordance with the ambient environment or other changing condition, changes according to the variation of the frequency of the clock signal P1.

Thus, if the synchronized serial input signal P3 was detected when the detecting signal P5 changes from being at a high level to a low level, the frequency of the detecting signal P5 would be changed according to the change in the frequency, and therefore, erroneous data different from the serial input signal is input to a receiving stage (not shown).

The following description relates to the case where the detecting signal P5 is output as shown in FIG. 2(F) in the case where the reference frequency of the clock signal P1 is changed by the variance of the ambient environment or temperature.

When the serial input signal P2 is input as shown in FIG. 2(B), "1110001" is output as the value of the received signal, from the detecting signal and the synchronized serial input signal, at the time of changing the detecting signal P5 from the high level to the low level unless there is a change in the detecting period. However, in the case where the detecting signal P5 that is output when the period of the clock signal P1 increases due to the change of the frequency is output as shown in FIG. 2(F), the value of the received signal becomes "1110011". That is because "0", the signal value output at the 6th filling edge after the detecting signal P5 is synchronized, is falsely recognized as a "1".

When the detecting signal P5 output by the frequency divider 3 is output as in the detecting signal P5 because the period of the reference frequency decreases, the value of the received signal detected from a receiving stage is "1110000", and in this case, "1", the value of the 7th falling edge b after synchronizing the detecting signal P5, is falsely recognized as a "0".

As described above, when the reference frequency is changed by the variation of the ambient environment and/or temperature, the period of the detecting signal changes, and as a predetermined time passes, the period thereof becomes delayed. Therefore a signal detected by the detecting signal is erroneous, as the period of the detecting signal increases continuously.

Such a case represents a fatal malfunction to a receiving device using a digital signal, and the variation of the ambient environment becomes a critical factor in designing circuits thereby setting a limit to the selection of the devices. Accordingly, the synchronizing and detecting circuits become complex and increase in size.

In an oscillating circuit using an inductor L or a capacitor C for generating the reference frequency signal, the oscillating frequency of the inductor L and capacitor C is easily changed by environmental conditions such as the temperature, humidity or air-pressure, or by long-time use. Therefore a phase-shift type oscillating circuit or a tuning type oscillating circuit cannot be used. A crystal oscillating circuit with high oscillating frequency stability must be used, which, however results in increased manufacturing costs.

SUMMARY OF THE INVENTION

An object of the present invention is to provide a circuit for synchronizing a serial input signal that is capable of detecting the correct serial input signal even if the reference frequency of a receiving stage is changed according to variation in the temperature or environment, or there is used a low-level resistance, inductance and capacitance type oscillating circuit that is sensitive to the change of the temperature and/or ambient environment.

Another object of the present invention is to provide a synchronous circuit for minimizing the number of external discrete elements by the use of a low-level oscillating circuit, and synchronizing a serial input signal suitable for an integrated circuit application.

To obtain the above objects, the present invention provides a synchronous system for a serial input signal, comprising: (1) a synchronous circuit for synchronizing a received serial input signal with a clock signal for supplying the reference frequency; (2) a delay synchronous circuit said synchronized serial input signal for delaying for a predetermined time in synchronization with said clock; (3) a reset signal generation circuit for generating a reset signal having a negative pulse with predetermined spaces at every rising and falling edge of the synchronized serial input signal received from the synchronous circuit; (4) an AND gate for outputting a logical product of said clock signal and said reset signal; (5) a frequency divider circuit reset by the reset signal output from the reset signal generating circuit and dividing the output of said AND gate; and (6) a detecting signal generation circuit for delaying the output of the frequency divider for a predetermined time the output of said frequency divider circuit providing the detecting signal necessary for detecting data included in said received serial input signal.

BRIEF DESCRIPTION OF THE DRAWINGS

The above objects, features and advantages of the invention are believed to be readily apparent from the following description of a preferred embodiment of the best mode of carrying out the invention when taken in conjunction with the drawings, wherein:

FIG. 1 is a block diagram showing a conventional synchronous circuit for a serial input signal;

FIGS. 2(A) to 2(G) are wave forms showing the operation of the synchronous circuit of FIG. 1;

FIGS. 5(A) to 5(Q) are waveforms showing the operation of the circuit shown in FIG. 4.

DESCRIPTION OF THE PREFERRED EMBODIMENTS

Figure 3:
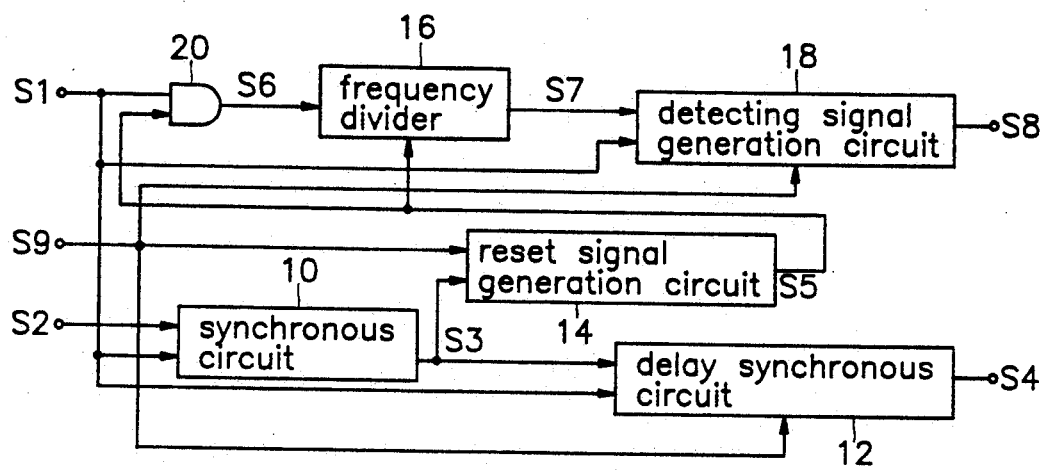
FIG. 3 is a block diagram of a synchronous circuit for a serial input signal in accordance with the present invention.

FIG. 3 shows a block diagram of a synchronous circuit in accordance with the present invention for synchronizing a received serial input signal and includes a synchronous circuit 10 receiving the serial input signal S2 and outputting a synchronized serial input signal S3 in accordance with a clock signal S1 supplying the reference frequency. A delay synchronous circuit 12 delays for a predetermined time the synchronized serial input signal S3 that is input from the synchronous circuit 10; A reset signal generation circuit 14 generates a reset signal S5 having a negative pulse of a predetermined space at every rising and falling edge of the synchronized serial input signal S3, inputting the synchronized serial input signal S3 from the synchronous circuit 10. A frequency divider 16 is reset according to the reset signal S5 output from the reset signal generation circuit 14 for dividing the clock signal S1 by a factor of eight. A detecting signal generation circuit 18 outputs a detecting signal S8 synchronized at the rising edge of the input clock signal S1 after receiving the output signal S7 from the frequency divider 16. A delayed serial input signal S4 generated by the delay synchronous circuit 12 is detected by the synchronized detecting signal S8, and input to another receiving circuit (not shown). Additionally, an AND gate 20 outputs a logical product of the clock signal S1 and reset signal S5 to minimize the delay time by the reset signal S5.

Figure 4:
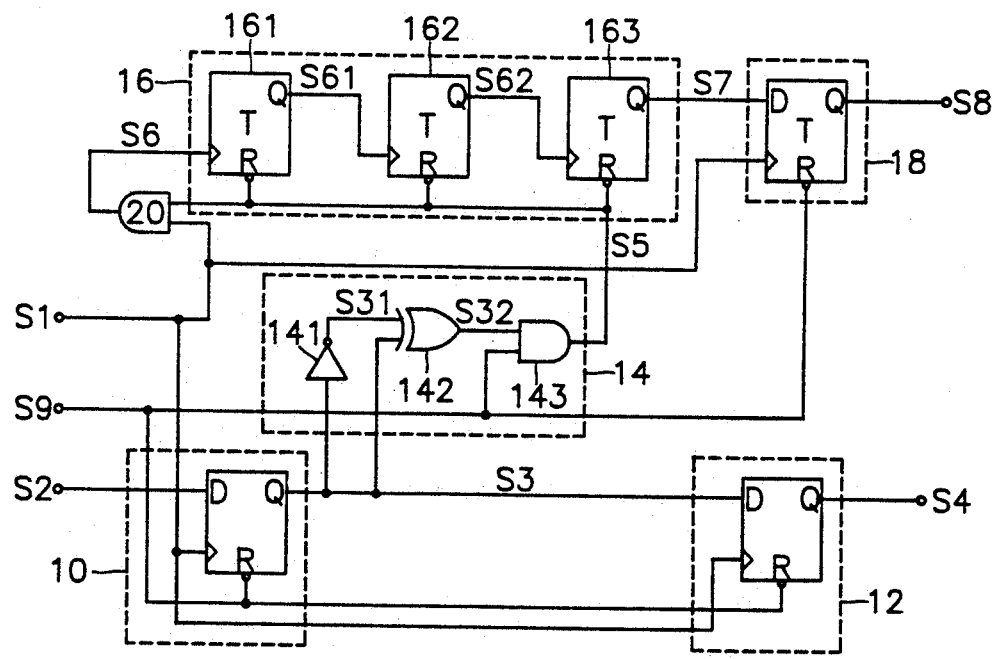
FIG. 4 is a detailed circuit schematic of the synchronous circuit for a serial input signal in accordance with the present invention.

FIG. 4 is a detailed circuit diagram of the block diagram of the present invention shown in FIG. 3; and FIGS. 5(A) to 5(Q) are waveforms illustrating the signals output from the components of FIG. 4. In FIG. 4 the synchronous circuit 10 is comprised of a single D type flip-flop, and when the serial input signal S2 is input to a data input terminal D, and a power reset signal S9 and the clock signal S1 are respectively input to a reset terminal R of the synchronous circuit 10 and a clock terminal, as shown in FIG. 5D, the synchronous circuit 10 generates the serial input signal S3 that is synchronized by synchronizing the serial input signal S2 at the rising edge of the clock signal S1.

The synchronized serial input signal S3 is input simultaneously to both the delay synchronous circuit 12 and reset signal generation circuit 14. The delay synchronous circuit 12 is comprised of a D-type flip-flop, and as the serial input signal S4 shown in FIG. 5(M) that is synchronized with the rising edge of the clock signal S1 supplied to the clock terminal, the serial input signal S2 is delayed and the synchronized serial input signal S4 is output.

The serial input signal S3 synchronized by the synchronous circuit 10, is input to the delay synchronous circuit 12, and at the same time, input to an inverter 141, an exclusive-OR gate 142 of the reset signal generation circuit 14 formed of an AND gate 143 outputting a logic product formed by an output signal of the exclusive-OR gate 142, and the power reset signal S9.

The inverter 141 receives the synchronized serial input signal S3 and outputs a signal to which the synchronized serial input signal S3 is delay-inverted for a predetermined time as a serial input signal S31 as shown at FIG. 5(E). The exclusive-OR gate 142 receives the synchronized serial input signal S3 and delay-inverted signal S31 of the inverter 141 and operates only at the rising edge and falling edge of the synchronized serial input signal S3 and output the negative pulse just having delayed time of the inverter 141 as shown in FIG. 5(F). The AND gate 143 is operated by receiving the output signal S32 of the exclusive-OR gate 142 and power reset signal S9 and outputs the reset signal S5 having the negative pulses synchronized at the rising edge c and falling edge d of the serial input signal S3 output and synchronized like S5 of FIG. 5(G), as the power reset signal S9 is always input as a high level signal during the operation of the circuit.

The frequency divider 16 includes first, second and third frequency dividers 161, 162 and 163, and the reset signal S5 is input to each reset terminal R of the frequency dividers 161, 162 and 163 respectively dividing the input frequency by a factor of two. Simultaneously therewith, the frequency divider 16 receives the clock signal S1 gated through the AND gate 26 by the reset signal S5 to minimize the delay time.

The first frequency divider 161 divides the output signal S6 of the AND gate 20 by a factor of two and outputs a signal like signal S61 in FIG. 5(I). The second frequency divider divides the signal S61 by a factor of two and a signal S62 is output as shown in FIG. 5(J). Finally, the third frequency divider 163 divides the signal S62 by a factor of two and outputs a signal S7 as shown in FIG. 5(K). Thus, the signal S7 is ⅛th the frequency of the output signal S6 of the AND gate 20.

After the power reset signal S9 is input to the reset terminal R, the detecting signal generation circuit 18 formed of D type flip-flop receives and synchronizes the divided signal S7 and outputs the detecting signal S8, as shown in FIG. 5(L).

In the case where the clock signal S1 is input periodically without variation of the frequency, as shown in FIG. 5(L), the data "1110001" can be detected at the time of changing from a high signal level to a low signal level with reference to the delayed synchronous serial input signal S4, when the serial input signal S2 is input as shown in FIG. 5(B).

on the other hand, in the case where the frequency of the clock signal S1 supplying the reference frequency increases or decreases due to a change in the ambient environment or temperature and the delay in the circuit, a detecting signal such as a signal S10 or S12 of FIGS. 5(N) or 5(P) is output in the case where the conventional circuit shown in FIG. 1 is applied. In such a case, if the period of the clock signal S1 increases, the data "1110011" is detected at the falling edge of the signal S10 shown in FIG. 5(N,). And if the period of the clock decreases, the data detected by the detecting signal S12 is "1110000". Thus, because errors are detected at the 6th and 7th edge, data input thereafter is erroneously detected.

According to the present invention, errors are prevented from being input to the next receiving circuit or stage (not shown by the above-described detection), the reset signal S5 is newly reset at the rising edge and falling edges of the serial input signal S3 synchronized when the period of the reference frequency increases or decreases, and certain parts of the period of the detecting signal decreases or increases as a signal S11 or S13 shown in FIG. 5(O) or 5(Q) thereby solving the problems that may occur due to the period changing in the case where the period of the reference frequency (clock) increases or decreases.

As described above, according to the operation of the conventional synchronous circuit, the frequency, i.e. the period of the clock signal, was easily changed by the ambient environment or temperature, and the conventional synchronous circuit is quite sensitive to variations of frequency.

According to the present invention, synchronous circuit for serial input signal, instead of using an expensive crystal oscillating circuit which is relatively immune from changes in oscillation frequency due to changes in the ambient environment, an inexpensive phase shift oscillating or tuning type oscillating circuit can be used as changes in the clock frequency are automatically taken care of, thereby enabling data stable for all changes of the frequency to be input and provides a synchronized serial input signal suitable for an operation with an integrated circuit.

What is claimed is:

1. A circuit for synchronizing a serial input signal with a clock signal, comprising:
   a circuit for synchronizing a received serial input signal with said clock signal for supplying a reference frequency to provide a synchronized serial input signal;
   a delay synchronous circuit for delaying said synchronized serial input signal for a predetermined time in synchronization with said clock signal;
   a reset signal generation circuit for generating a reset signal having a negative pulse of predetermined space only at every rising and falling edge of said synchronized serial input signal;
   an AND gate for outputting a logical product of said clock signal and said reset signal;
   a frequency divider circuit reset by said reset signal and for dividing the output of said AND gate; and
   a detecting signal generation circuit for delaying the output of said frequency divider circuit for a predetermined time, the output of said frequency divider circuit providing the detecting signal necessary for detecting data included in said received serial input signal.

2. A synchronous circuit according to claim 1 wherein said reset signal generation circuit includes an inverter for delay-inverting said synchronized serial input signal for a predetermined time;
   an exclusive-OR gate for outputting a high level signal having a negative pulse low level of predetermined time only at every rising and falling edge of the synchronized serial input signal upon receiving the synchronized serial input signal and output signal of said inverter.

3. A synchronous circuit according to claim 1, wherein said frequency divider circuit is reset at every rising and falling edge of said synchronized serial input signal.

4. A synchronous circuit according to claim 2, wherein said frequency divider circuit is reset at every rising and falling edge of said synchronized serial input signal.

5. A synchronous circuit according to claim 2, wherein said reset signal generation circuit further includes an AND gate for outputting a logical product of the clock signal and the reset signal.

6. A synchronous circuit according to claim 1, wherein said frequency divider circuit includes a first frequency divider circuit for dividing by a factor of two the logical product of said clock signal and said reset signal input to a clock terminal;
   a second frequency divider circuit for dividing by a factor of two the output signal of said first frequency divider circuit input to the clock terminal; and
   a third frequency divider circuit for dividing by a factor of two the output of said second frequency divider circuit input to the clock terminal.

7. A synchronous circuit according to claim 1, wherein said detecting signal generation circuit is reset by a power reset signal and comprises a D type flip-flop for generating the detecting signal synchronized with said clock signal to exclude the unnecessary detecting signal generated by said reset signal among the detecting signal generated by said frequency divider circuit.

8. A synchronous circuit according to claim 1, wherein said delay synchronous circuit comprises a D-type flip-flop reset by the power reset signal.

* * * * *